United States Patent [19]

Nakagawa et al.

[11] Patent Number: 5,777,205

[45] Date of Patent: Jul. 7, 1998

[54] APPARATUS FOR ANALYSIS OF MIXED GAS COMPONENTS

[75] Inventors: Kazuo Nakagawa; Hiromi Yamazaki; Kenichi Uchida; Yukio Naruse, all of Shizuoka-ken, Japan

[73] Assignee: Nikkiso Company Limited, Tokyo, Japan

[21] Appl. No.: 721,524

[22] Filed: Sep. 26, 1996

[30] Foreign Application Priority Data

Sep. 29, 1995 [JP] Japan ................... 7-252993

[51] Int. Cl.$^6$ ............... G01N 21/00; G01N 7/00; B01D 59/44
[52] U.S. Cl. .......... 73/24.02; 73/23.2; 250/281; 250/291
[58] Field of Search ................. 250/282, 281, 250/291, 292, 283; 73/23.2, 24.02

[56] References Cited

U.S. PATENT DOCUMENTS

| | | | |
|---|---|---|---|
| 3,742,212 | 6/1973 | McIver | 250/41.9 DS |
| 3,937,955 | 2/1976 | Comisarow et al. | 250/283 |
| 4,686,365 | 8/1987 | Meek et al. | 250/281 |
| 4,959,543 | 9/1990 | McIver et al. | 250/291 |
| 5,206,506 | 4/1993 | Kirchner | 250/281 |
| 5,264,697 | 11/1993 | Nakagawa et al. | 250/291 |
| 5,389,784 | 2/1995 | Weller | 250/291 |
| 5,498,545 | 3/1996 | Vestal | 250/288 X |
| 5,605,798 | 2/1997 | Koster | 435/6 |

OTHER PUBLICATIONS

Precision Molecular Spectroscopy with Cold Trapped Atoms, APS News, Henry C. Kapteyn, Margaret M. Murnane, spring, 97.

Villinger et al., "SIMS 500–Rapid Low Energy Secondary Ion Mass Spectrometer for In–Line Analysis of Gaseous Compounds–Technology and Applications in Automotive Emission Testing", V&F Analyse–UND Messtechnik GmbH, pp. 1–6, 1993.

Nogar et al., "Detection of Copper in Isolated Plant Cells by Resonance Ionization Mass Spectrometry", Analytical Chemistry, vol. 64, No. 23, pp. 2972–2976, Dec. 1, 1992.

(List continued on next page.)

*Primary Examiner*—Hezron E. Williams
*Assistant Examiner*—Jay L. Politzer
*Attorney, Agent, or Firm*—Browdy and Neimark

[57] ABSTRACT

The present invention provides an apparatus for the analysis of mixed gas components which can perform, in high precision, determination of the quantities of components contained in a sample gas containing a plurality of the components having molecular weights close to each other and which has a Fourier transform mass spectrometric means for ionizing a sample gas, applying a high frequency electric field to the ionized gas to induce cyclotron resonance, detecting the cyclotron resonance as a high-frequency decaying electric signal, and converting the resulting high-frequency decaying electric signal to a frequency-domain signal and a wavelength variable light irradiating means for irradiating a light of a single wavelength to ionize the molecules of the components constituting the sample gas, said irradiating means being able to vary the wavelength and/or intensity of the irradiation light.

2 Claims, 6 Drawing Sheets

OTHER PUBLICATIONS

Bernstein, "Systematics of Multiphoton Ionization–Fragmentation of Polyatomic Molecules", The Journal of Physical Chemistry, vol. 86, No. 7, pp. 1178–1184, 1982.

Irion et al., "Multiphoton Ionization Detected by Fourier–Transform Mass Spectrometry", Chemical Physics Letters, vol. 93, No. 4, pp. 375–379, Dec. 10, 1982.

Sack et al., "Gas Chromatography/Multiphoton Ionization Fourier Transform Mass Spectrometry", Analytical Chemistry, vol. 57, No. 7, pp. 1290–1295, Jun. 1985.

Lubman et al., "Mass Spectrometry of Aromatic Molecules with Resonance–Enhanced Multiphoton Ionization", Analytical Chemistry, vol. 54, No. 4, pp. 660–665, Apr. 1982.

Rettner et al., "Resonance Enhanced Laser Ionisation Mass Spectrometry of Four Aromatic Molecules", Chemical Physics, vol. 56, pp. 53–61, 1981.

Lubman et al., "Multiphoton Ionization of Azulene and Naphthalene", Journal of Chem. Phys., vol. 72, No. 5, pp. 3034–3040, Mar. 1, 1980.

Dietz et al., "Efficient Multiphoton Ionization of Jet–Cooled Aniline", Chemical Physics Letters, vol. 70, No. 2, pp., 246–250, Mar. 1, 1980.

APPARATUS FOR ANALYSIS OF MIXED GAS COMPONENTS

TECHNICAL FIELD

The present invention relates to an apparatus for the analysis of mixed gas components which can separate the respective components constituting a sample gas which is a mixed gas, identify the components and determine the quantities of them in a short time.

PRIOR ART

Industrially, there are a lot of necessities to separate individually the components constituting a mixed gas and determine the quantities of them. The analysis of mixed gases are carried out in various fields, particularly, in the fields of industrial analysis, for example, analysis of exhaust gas from automobiles, analysis of reaction gas in chemical industry processes and control of reaction process, analysis of respiratory gases for knowing the process of medical treatment and biological reaction. It becomes necessary to separate the components individually and determine the quantities thereof in the analysis. Besides, in many of these cases, rapid analysis is required.

For example, in the exhaust gas analysis, a rapidness of the order of millisecond to second is desired as a measuring period. In the respiratory gas analysis, it is required that measurement data at ten points or more can be obtained during one respiration cycle (3–4 seconds). In a process of chemical industries, a longer measuring period is allowed, but, even in this case, if the analysis period is shorter, more times of measurement can be performed in the same measuring time. If more times of measurement can be conducted in a given measuring time, analytcal accuracy can be improved by the known time averaging method. In the field of industrial analysis, there have hitherto been often employed those methods which use, in combination, various apparatus for the analysis of the various sample components respectively, such as hydrogen, water, ammonia, oxygen, hydrocarbons, etc.

However, although the use of a combination of these exclusive analytical apparatus may be sometimes advantageous for the improvement of sensitivity in that the physical or chemical properties peculiar to the respective sample components are measured, a plurality of analytical apparatus differing in principles depending on the kinds of the components must be provided. Besides, if different components having the same properties are contained, responses corresponding to the said components overlap in the output of the analytical apparatus, and the responses of the respective components cannot be discriminated from each other. Presence of such interfering components causes unexpected errors in measurement.

Generally, in these industrial analyses, it is desired essentially that simultaneous analysis of many components can be performed in a real time. In order to satisfy the demand for simultaneous measurement of many components, the conventional annalytical apparatus based on the difference in chemical properties of the components is limited to dealing with such components as having similar chemical properties, and there have been inevitable difficulties in multi-component analysis. Therefore, for this purpose, physical measurement, so-called instrumental analysis, in which the differences of physical properties possessed by any materials in common being measured, are desirable. Spectrometric apparatuses such as gas chromatograph (hereinafter referred to as "GC") and infrared spectrometer (hereinafter referred to as "IR") have been conventionally used for separation and determination of components of a mixed gas. However, as for the GC method, owing to its operational principle that the respective components are separated with lapse of time on the basis of the difference in retention time of the respective components passing through the separation column, there are serious problems In that the setting of measuring conditions, such as the selection of the column for the respective components to be analyzed, the determination of the temperature condition in the oven in which the column is put, or the setting of flow rate of the carrier gas are complicated, and that depending on the number or the kind of the components, a complex means or multi-dimensional column is needed from the viewpoint of hardware and rich experience and high skill are needed from the viewpoint of software. Furthermore, some of the different components can be equal or nearly equal in the retention time, and, naturally, separation of these components from each other is impossible or difficult. In addition, as well known, the GC method requires a long time of several minutes to several ten minutes as a measuring period, and this method cannot be applied to the above-mentioned high-speed analysis.

In direct analysis of a mixed gas by an infrared spectrometer, in many cases, the absorption lines corresponding to the respective components overlap each other and a resolution sufficient to distinguish a sprctrum of a component from that of the other cannot be obtained. Furthermore, components having no infrared absorption, such as nitrogen, oxygen, chlorine and hydrogen cannot be detected. Sulfur dioxide, carbon dioxide, water and the like produce interference between spectra. Thus, in general, the discrimination of the components of a mixed gas is considerably difficult.

Ultraviolet spectroscopy and other spectroscopic analyses have the same problems as the above in general-purpose use.

The analytical principle of mass spectrometer is to ionize gas molecules introduced into a vacuum chamber and discriminate the gas components by the ratio of mass and charge. Therefore, there are substantially no undetectable gas components and the mass spectrometry can be said to be an analytical means which has the highest general-purpose usability in multi-component analysis.

However, regarding gas components equal in the mass number, spectrum peaks thereof overlap and the discrimination of the components is generally difficult. Conventionally employed methods in such case are as follows:

(a) collating the mass spectra of the component gases with each other and selecting the peaks which have no overlapping in the spectra (hereinafter, referred to as unipeaks) to perform the discrimination:

(b) discriminating the components from group of component peaks present together by multiple regression analysis;

(c) connecting a gas chromatograph column in front of a mass spectrometer, whereby a mixed gas is separated into pure components, and identifying and determining the respective pure components eluted from the column in succession by a mass spectrometer;

(d) measuring the mass of component peak in a high resolution, i.e. an ability of separating resonance lines of samples having close molecular weights and being defined to be "molecular weight/full width at half height", of $10^3$–$10^4$ which enables the detection of the mass defect of atoms constituting a molecule by using a high resolution mass spectrometer, and thus, obtaining the chemical composition of the components;

The method of (a) lacks general applicability because the unipeak differs depending on the component composition of the sample gas and, furthermore, proper peaks are not always found.

The method of (b) can be applied under the condition that mass spectra of all of the components of the mixed gas are known and pattern coefficient thereof have been correctly obtained. When unknown component is contained, there is a disadvantage that an unexpectedly great error occurs.

The method of (c) has the same problems as of the gas chromatograph, such as a long measuring period.

The method (d) is a method for obtaining chemical composition of the gas components by accurately measuring the mass of component ion, which is possible only by using a large double-forcusing mass spectrometer having a high resolution or Fourier transform ion cyclotron resonance mass spectrometer (hereinafter, referred to "FT-ICR"). Especially, FT-ICR method has a great feature that measurement can be performed rapidly in a short time of from about several ten milliseconds to the order of second, however, a double—forcusing mass spectrometer is so large that it is not suitable for installing at an industrial analysis site, and therefore, there have been no examples of using it for industrial analysis.

Components having the same chemical composition cannot be separated even by a FT-ICR. For example, all of isobutene, 1-butene and 2-butene have not only a mass number of 56 but also a chemical composition of $C_4H_8$, and, hence, they have utterly the same molecular weight of 56.06260. Therefore, it is impossible even with a high resolution of $10^4$–$10^6$ or higher of FT-ICR to carry out separation and determination of these components only by accurate measurement of the mass. This brings about serious problems in rapid analysis of a mixed gas rich in hydrocarbons containing various isomers as in the analysis of exhaust gas from motorcar engines.

The object of the present invention is to provide a new apparatus for the analysis of mixed gas components which can perform separation and determination of quantities of not only a plurality of components differing in molecular weight, but also isomers of the same molecular weight such as the above-mentioned hydrocarbons.

Another object of the present invention is to provide an apparatus for the analysis of mixed gas components which can perform determination of quantities, with high accuracy, of components in a sample gas which is a mixture of a plurality of components which are equal in molecular weight, but differ in ionization potential.

Still another object of the present invention is to provide an apparatus for the analysis of mixed gas components which can perform determination of quantities, with high accuracy, of components in a sample gas which is a mixture of a plurality of molecules which are equal or near in ionization potential, but differ in molecular weight.

DISCLOSURE OF INVENTION

The present invention which aims at accomplishment of the above objects is an apparatus for the analysis of mixed gas components, characterized by comprising a Fourier transform mass spectrometric means which ionizes a sample gas introduced into a high-vacuum cell placed in a static magnetic field, applies a high-frequency electric field to the ion by applying a high-frequency to a pair of irradiation electrodes provided in the high-vacuum cell, induces an ion cyclotron resonance for the ion of a specific component to be measured, detects said ion cyclotron resonance as a high-frequency decaying electric signal, converts the high-frequency decaying electric signal to a digital signal, and converts the digital high-frequency decaying electric signal which is a time-domain signal to a frequency-domain signal, and a variable wavelength light irradiating means which irradiates said sample gas with a light of a single wavelength to impart an ionization energy to the molecule of the components constituting the sample gas, the wavelength of the light irradiated to the sample gas being able to be varied.

The apparatus for the analysis of mixed gas components of the present invention will be explained below.

The apparatus for the analysis of mixed gas components of the present invention has a Fourier transform mass spectrometric means which ionizes a sample gas, applies a high-frequency electric field to the ion by applying a high-frequency to a pair of irradiation electrodes provided in a high-vacuum cell to induce an ion cyclotron resonance for the ion of a specific component to be measured, detects said ion cyclotron resonance as a high-frequency decaying electric signal, converts the high-frequency decaying electric signal to a digital signal, and converts the digital high-frequency decaying electric signal which is a time-domain signal to a frequency-domain signal, and a wavelength variable light irradiation means which irradiates said sample gas with a light of a single wavelength which ionizes the molecule of the components constituting the sample gas and is constituted so that the wave length of irradiation light can be continuously varied.

In this apparatus for the analysis of mixed gas components, molecules having an ionization potential lower than the energy level of an irradiation light having a given wavelength are ionized, while molecules having an ionization potential higher than the energy level of the irradiation light are not ionized and removed from the measuring system as neutral gas molecules. That is, mass spectra free from overlapping of the spectra of unnecessary ions are obtained by selective ionization, and, furthermore, determination of a spectrum peak becomes possible by the high mass resolution which is a feature of the Fourier transform mass spectrometric means.

Another embodiment of the apparatus for the analysis of mixed gas components of the present invention comprises a Fourier transform mass spectrometric means which applies a high-frequency electric field to ion by applying a high-frequency to a pair of irradiation electrodes provided in a high-vacuum cell to induce an ion cyclotron resonance for the ion of a specific component to be measured, detects said ion cyclotron resonance as a high-frequency decaying electric signal, converts this high-frequency decaying electric signal to a digital signal, and converts the digital high-frequency decaying electric signal which is a time-domain signal to a frequency-domain signal, a variable wavelength light irradiating means which irradiates said sample gas with a light of a single wavelength which ionizes the components constituting the sample gas and is constituted so that the wave-length of the irradiation light can be varied, and a subtraction processing means which subjects to subtraction processing a first mass spectrum detected by irradiating the sample gas with an irradiation light of a given wavelength and a second mass spectrum detected by irradiating the sample gas with an irradiation light of a given wavelength which differs from the wavelength of the first irradiation light.

In this apparatus for the analysis of mixed gas components, the component having an ionization potential lower than the energy level of an irradiation light having a given wavelength is ionized by irradiating the sample gas with a light having a given wavelength by the variable wavelength light irradiating means and the component having an ionization potential higher than the energy level of irradiation light is not ionized and removed from the measuring system as neutral gas molecules. That is, ionization is selective. Overlapping of unnecessary ions is avoided by this selective ionization, and the first mass spectrum of high precision is obtained by the Fourier transform mass spectrometric means. Subsequently, the sample gas is irradiated with a light of wavelength different from that of the light irradiated before, thereby to ionize the component having an ionization potential lower than the energy level of the irradiation light of the above wavelength, and he component having an ionization potential higher than the energy level of the irradiation light is not ionized and removed from the measuring system as neutral gas molecules. Overlapping of any spectra of unnecessary ions is avoided by this selective ionization, and the second mass spectrum of high precision is obtained by the Fourier transform mass spectrometric means. The first mass spectrum and the second mass spectrum are subjected to subtraction processing by the subtraction processing means to obtain a difference spectrum. The resulting difference spectrum is a mass spectrum of only the component having an ionization potential equal to the gap between the energy level of the first irradiation light and that of the second irradiation light. By selecting the respective wavelengths of the first and second irradiation lights, it becomes possible to freely and selectively obtain mass spectra of any desired gas components even of a sample gas which is a mixed gas showing complex mixed spectrum, and it becomes possible to determine spectrum peaks of any components.

Another embodiment of the apparatus for the analysis of mixed gas components of the present invention comprises a Fourier transform mass spectrometric means which applies a high-frequency electric field to ion by applying a high-frequency to a pair of irradiation electrodes provided in a high-vacuum cell to induce an ion cyclotron resonance for the ion of a specific component to be measured, detects said ion cyclotron resonance as a high-frequency decaying electric signal, converts this high-frequency decaying electric signal to a digital signal, and converts the digital high-frequency decaying electric signal which is a time-domain signal to a frequency-domain signal, and a wavelength variable light irradiation means which irradiates the sample gas with a light of a single wavelength which ionizes the components constituting the sample gas, and is constituted so that the wavelength of the irradiation light can be continuously varied and that the luminous intensity of the irradiation light can be freely adjusted.

In the analysis of mixed gas components by this apparatus, by appropriately adjusting the luminous intensity of the first irradiation light and that of the second irradiation light, fragment peaks can be diminished or removed from a spectrum peak of a component and a mass spectrum consisting of only a molecule peak can be obtained. Thus, mass spectrum peaks can be easily identified or determined by the adjustment of luminous intensity.

The apparatus for the analysis of mixed gas components of the present invention will be further explained below.

The Fourier transform mass spectrometric means in the apparatus for the analysis of mixed gas components of the present invention can be of any constructions which can realize the functions of applying a high-frequency electric field to ion by applying a high Frequency to a pair of irradiation electrodes provided in a high-vacuum cell to induce an ion cyclotron resonance for the ion of a specific component to be measured, detecting said ion cyclotron resonance as a high-frequency decaying electric signal, converting this high-frequency decaying electric signal to a digital signal, and Fourier transforming the digital high-frequency decaying electric signal which is a time-domain signal to a frequency-domain signal. A suitable example of the apparatus has the following means:

(1) a magnetic field applying means which applies a static magnetic fields to ions to induce an ion cyclotron movement for the ions, (2) a high-vacuum means containing an analysis cell into which a sample gas is introduced and in which molecules of the components constituting the sample gas are ionized, (3) an electronic circuit devise which causes resonance-excitation of the ions in said analysis cell and detects and amplifies an induction current induced in a receiving electrode by the movement of the ions, and (4) a controlling-operating means which carries out various operations such as setting a condition for measurement, Fourier transformation and others.

The variable wavelength light irradiating means in the apparatus for the analysis of mixed gas components of the present invention is designed so that it can impart an ionization energy to the component molecules constituting the sample gas and the wavelength of the light to be irradiated to the sample gas, i.e. irradiation light, can be continuously varied and Further the luminous intensity of said irradiation light can be changed.

The above-mentioned magnetic field applying means is a mechanism which induces an ion cyclotron movement for the ions present in the analysis cell, and is provided with, for example, a magnet which applies a static magnetic field to the analysis cell, and, preferably, further provided with a magnetic field generating means having a magnetic field correcting coil. In this magnetic field applying means, preferred is a magnetic circuit which comprises a pair of magnets arranged opposite to each other so that there is provided a space sufficient to place the analysis cell between them, a supporting member which holds the pair of the magnets to support them, and pole pieces provided on magnetic pole surface of the pair of the magnets. In the magnetic circuit having such structure, leakage flux can be reduced very much, and utilization of homogeneous magnetic field space at the center of the gap between the magnetic poles becomes easy because the space between the supporting means is in the opened state. Further, a space of homogeneous magnetic field can be obtained by designing the opposing faces of the pole pieces in a proper shape. In other words, preferably, the opposing faces of the pole pieces are designed in such a shape that uniformity of magnetic field distribution can be improved. The magnet which constitutes the magnetic field applying means may be either a permanent magnet or an electromagnet if a resolution of at least about $10^4$ can be obtained. Among a permanent magnet and an electromagnet, a permanent magnet is suitable from the point of easiness in installation and maintenance.

The above-mentioned high-vacuum means is a device for maintaining a high vacuum in the analysis cell and retaining ions in the cell over a long period of time. For example, it has an analysis cell having a space in which a sample gas is allowed to be present, a vacuum chamber containing the analysis cell, a sample gas introducing means for introducing a sample gas into the analysis cell and an evacuation means for evacuating the analysis cell and the vacuum chamber to a high vacuum. In order to obtain a high resolution, the life of the ions present in the analysis cell must be at least 100 ms, and for this purpose, the pressure inside the analysis cell is preferably at a high vacuum of about $10^{-7}$. Therefore, it is preferred to design the vacuum chamber so that inside of the vacuum chamber which contains the analysis cell becomes highly vacuum. Further, in order to accomplish such a high vacuum, it is preferred to combine some of evacuation pumps, and suitable is a combination of an oil-free type turbo molecular pump, a molecular drag pump and a diaphragm pump which are connected in tandem.

The analysis cell can be formed of three pairs of electrode groups comprising trap electrodes, irradiation electrodes and receiving electrodes to ionize the sample gas in the cell and cause ion cyclotron movement of the ion. The analysis cell may be a cylindrical analysis cell which comprises a cylindrical body having a center axis along the direction of the magnetic field with the side wall being divided to four equal parts and plates provided at both ends of the cylindrical body. Furthermore, a hexahedral analysis cell can be employed where said three pairs of electrodes are three pairs of parallel electrodes which cross at right angles.

The wavelength variable light irradiating means is formed so that a light capable of ionizing the molecules in the sample gas in the analysis cell can be irradiated and the wavelength of the irradiation light can be continuously varied.

A suitable wavelength variable light irradiating means has a structure based on multi-photon ionization method (hereinafter, referred to MPI). One of the features of this MPI method is that the kind of molecule ionized can be selected by the wavelength of the irradiation light. This feature is based on the phenomenon that since each gas molecule has its peculiar ionization potential, a molecule having an ionization potential lower than hν is ionized and a molecule having an ionization potential higher than hν is hardly ionized, wherein the frequency of the irradiation light is ν and h is Planck constant. Accordingly, the light irradiated to the sample gas is desirably a coherent light of a single frequency.

According to the principle of MPI, there are three modes, namely, non-resonant MPI (harerinafter, referred to NRMPI), resonant two-photon ionization (hereinafter, referred to R2PI) and two photon resonant ionization (hereinafter, referred to TPRI) for the ionization of gas molecules by excitation.

In the case of the non-resonant MPI, molecules are immediately excited to ionization potential from ground state by instantaneously applying energy of many photons to the molecules. Therefore, the variable wavelength light irradiating means which employs the non-resonant MPI needs a high energy laser beam emitting means. In other words, when this non-resonant MPI is employed, it is necessary to irradiate a laser beam of high energy level, namely, of short wavelength. That is, a laser emitter extending over the far ultraviolet region may sometimes be needed.

In R2PI, some photon excites the molecule from ground state to an intermediate state, i.e. a level present between the ground state and the ionization potential. This intermediate state is a metastable state, and the excited molecules return to the ground state from the intermediate state at an attenuation factor β. Thus, when the number of molecules excited to the intermediate state is greater than that of molecules returning to the ground state at an attenuation factor β, most of the gas molecules are excited to the intermediate state by irradiation light by properly increasing the luminous intensity, i.e. intensity of light, of the irradiation light, during which when the second photon is irradiated, the molecules are further excited and obtain an energy higher than the ionization potential of the molecules to become ions. Therefore, even when a light of an energy level lower than the ionization potential of the molecules is irradiated, the molecules are efficiently ionized.

In TPRI, two or more photon energy is nearly simultaneously given to the molecule to excite the molecule from the ground state to the intermediate state. In this process, ionization efficiency is lower than in R2PI. When TPRI is employed, it suffice to employ a low level laser, namely, a long wavelength laser, but the power thereof must be increased.

In the present invention, any methods of non-resonant MPI, resonant two-photon ionization and two photon resonant ionization can be employed and a suitable method is selected depending on the desired analysis, taking into consideration the characteristics of the respective methods.

In the present invention, a suitable light irradiating means usually has a means for irradiating the sample gas in the analysis cell with a coherent light of simple frequency, preferably has a laser beam emitting means which can emit a laser beam having substantially a simple frequency, such as ultraviolet laser beam. For example, when hydrocarbons are to be analyzed, the wavelength of laser beam to be irradiated should be 200–400 nm in R2PI since the ionization potentials of hydrocarbons are mostly in 7–12 eV.

By the irradiation of a coherent light having a single frequency to a sample gas, mass spectra of the respective components of different ionization potential contained in said gas sample can be obtained.

Another preferable variable wavelength light irradiating means has said laser beam emitting means and a luminous intensity varying means, i.e. light intensity varying means, for varying the irradiation luminous intensity of the laser beam emitted by said laser beam emitting means. When a variable wavelength light irradiating means having the luminous intensity varying means is employed, the proportion of fragment ion and molecular ion can be controlled by varying the irradiationluminous intensity of the laser beam and, thus, control of so-called soft/hard ionization becomes possible. By irradiating a sample gas containing components which have identical or close ionization potential, but differ in molecular weight with a light having suitably selected intensity, a mass spectrum in which molecule peaks of the respective components clearly appear can be obtained.

A suitable apparatus for the analysis of mixed gas components has a wavelength varying means which varies wavelength of the light from the above-mentioned variable wavelength Light irradiating means. As suitable examples of the wavelength varying means, variable wavelength lasers such as dye laser pumped by YAG laser can be mentioned. When a dye laser is employed, since the wavelength of the emitted light is too long to obtain a necessary energy level, it is desirable to provide a device for converting the frequency of said emitted light to its harmonic frequency, for example, a frequency doubler or tripler. If the wavelength varying means is provided, the sample gas can be irradiated with a light having different wavelength each time, and a mass spectrum of a specific component can be obtained from the mass spectra obtained by the respective irradiations.

The aforementioned electronic circuit device has a function of subjecting the ion in the analysis cell to resonant excitation, detecting a signal and amplifying the detected signal. This electronic circuit device has, for example, a high-frequency transmitting means which transmits a high-frequency to the irradiation electrode in the analysis cell and a receiving means which processes the signal received by the receiving electrode in the analysis cell.

The controlling-operating means performs measurement controlling and various operations such as Fourier transformation. A suitable controlling-operating means has a Fourier transformation means for converting to a frequency-domain signal a high-frequency decaying signal detected by a receiving means such as a receiving electrode for detecting an ion cyclotron resonance signal derived in the analysis cell and amplified to convert it to a digital signal, a memory means for memorizing a mass spectrum which is a frequency-domain signal obtained by the Fourier transformation means, and a subtraction processing means for subtraction processing wherein a substraction is carried out between specific mass spectra, i.e. the first mass spectrum, obtained by irradiating the sample gas with an irradiation light of a specific wavelength and memorized by the memory means, and another mass spectrum, i.e. the second mass spectrum, obtained by irradiating the sample gas with an irradiation light of a wavelength slightly differing from the said specific wavelength and memorized by the memory means. By the apparatus for the analysis of mixed gas components having the variable wavelength light irradiating means provided with a wavelength varying means and the controlling-operating means provided with a memory means and a subtraction processing means, the respective components in a sample gas containing a plurality of components having the same or nearly the same molecular weight, but differing inionization potential can be identified and quantitated. Furthermore, by the apparatus for the analysis of mixed gas components having the variable wavelength light irradiating means provided with a wavelength varying means and a luminous intensity varying means and the controlling-operating means provided with a memory means and a subtraction processing means, the respective components in a sample gas containing a plurality of components having the same or nearly the same molecular weight, but differing in ionization potential can be separated and quantitated. The respective components in a sample gas containing a plurality of components differing in the molecular weight, but having the same or nearly the same ionization potential also can be separated and quantitated by the above-mentioned apparatus.

The apparatus for the analysis of mixed gas components of the present invention is used in the following manner.

A sample gas is introduced into an analysis cell placed in a high vacuum. A static magnetic field is applied in the analysis cell. The sample gas in the analysis cell is irradiated with a light of a specific wavelength by the light irradiating means. The sample gas in the analysis cell is ionized by the irradiation with light. The produced ions from the sample gas are irradiated with a high frequency having an irradiation frequency near the ion cyclotron resonance frequency, whereby the ions cause ion cyclotron resonance. The ion cyclotron resonance is detected as a high-frequency decaying signal, converted to a digital signal, Fourier transformed and stored in the memory means as a mass spectrum.

If the sample gas contains a specific component to be measured and other components and the components other than said specific component have a sufficiently high ionization potential, the mass spectrum of the specific component to be measured can be obtained by irradiating a light having a specific wavelength sufficient to excite molecules of the component to be measured to the ionization potential of the component to be measured, and, as a result, the separation and the determination of the component to be measured become possible. In this case, since a component having an ionization potential higher than that of the component to be measured is not ionized, the mass spectrum of this component cannot be obtained. That unionized component is usually eliminated from the measuring system.

On the other hand, when a sample gas containing the component to be measured and other components having ionization potentials higher and lower than the ionization potential of the component to be measured is subjected to measurement, the sample gas is irradiated with the first irradiation light having a wavelength which is sufficiently short for exciting molecules of the component to be measured to the ionization potential thereof. The resulting mass spectrum, i.e. the first mass spectrum, includes mass spectra of other components having ionization potential lower than that of the component to be measured. The composite mass spectrum comprising a plurality of mass spectra is stored in the memory means. Furthermore, molecules of other components having an ionization potential higher than the excited ions of the component to be measured are not ionized and usually eliminated from the measuring system. Then, the sample gas is irradiated with the second irradiation light having a wavelength slightly different from the wavelength of the previous irradiation light. This irradiation light excites the molecules having lower ionization potential than that of the component to be measured, and the second mass spectrum corresponding to these components is obtained. This mass spectrum is also a composite mass spectrum of the excited components. This composite mass spectrum is also stored in the memory means.

Then, the first mass spectrum and the second mass spectrum are called out from the memory means and are subjected to subtraction processing by the subtraction processing means. As a result of the subtraction processing, a difference spectrum is obtained. This difference spectrum is a mass spectrum of the component having an ionization potential equal to the slight energy gap between the first irradiation light and the second irradiation light. By appropriately selecting the wavelength of the first irradiation light and the second irradiation light, mass spectra of any components equal in ionization potential in a sample gas which shows a complex composite spectrum can be selectively obtained.

In the apparatus for the analysis of mixed gas components of the present invention, luminous intensity of the light irradiated to the sample gas is optionally adjusted to diminish or remove fragment peaks from mass spectrum peaks of the component to be measured, whereby a mass spectrum comprising only the molecule peak of the component to be measured can be obtained and, thus, it becomes easy to identify or determine the mass spectrum peaks.

BRIEF DESCRIPTION OF THE DRAWINGS

Figure 1:
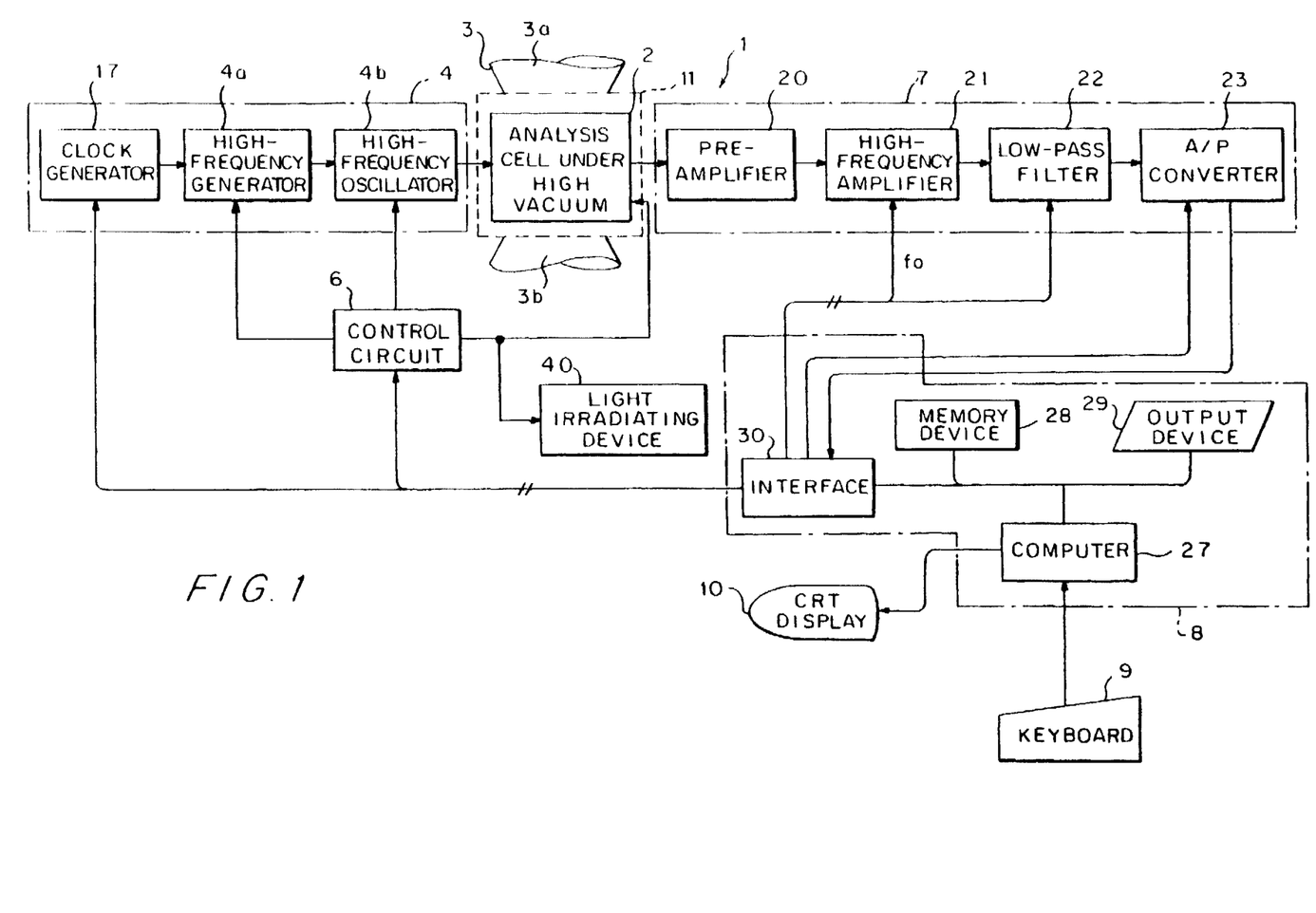
FIG. 1 is a schematic block diagram which shows a Fourier transform ion cyclotron resonance mass spectrometer as one embodiment of the present invention.

FIG. 1 is a general circuit block diagram showing the Fourier transform mass spectrometric means which is one embodiment of the present invention.

Figure 3:
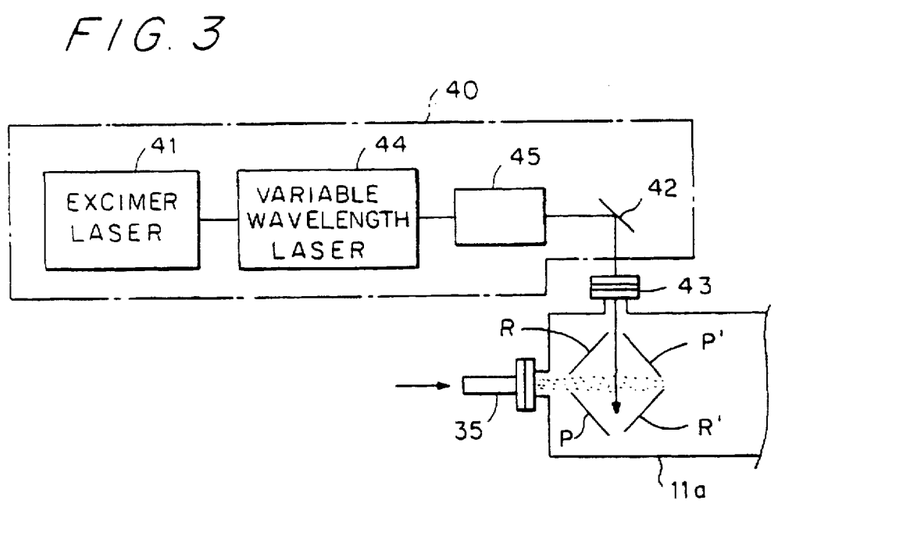
FIG. 3 is a schematic diagram of a light irradiating device in the Fourier transform ion cyclotron resonance mass spectrometer which is one embodiment of the present invention.

As shown in FIG. 1, Fourier transform mass spectrometric means 1 has a high vacuum means which is not shown in FIG. 1 containing analysis cell 2 in which the molecules of components constituting a sample gas are ionized, a magnetic field applying means having permanent magnet 3, a light irradiating device 40, which is not shown in FIG. 1, but shown in FIG. 3, being a variable wavelength light irradiating means which irradiates the sample gas in the analysis cell 2 with a light and which can continuously vary the wavelength of the light to be irradiated to the sample gas, an electronic circuit device provided with high-frequency transmitting means 4 and resonance signal detecting means 7, a controlling-operating means provided with control circuit 6 which carries out control of high-frequency pulse system relating to ion cyclotron resonance by the instructions from computer 27 and control of the light irradiating device 40 and operation controlling means 8, keyboard 9 and CRT display 10.

Figure 5:
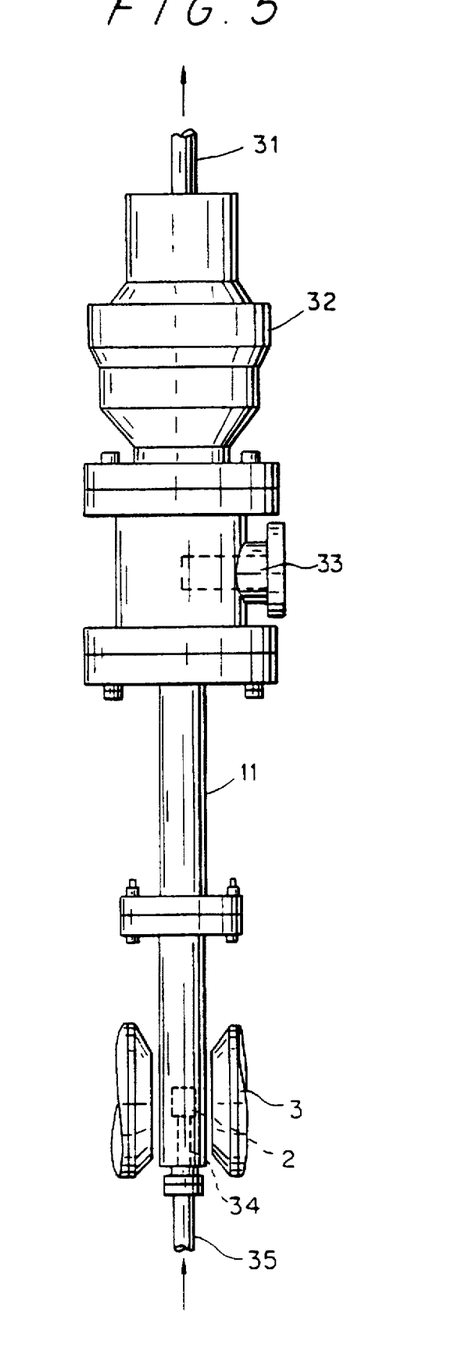
FIG. 5 is a front view of a vacuum chamber in the Fourier transform ion cyclotron resonance mass spectrometer which is one embodiment of the present invention.
Figure 6:
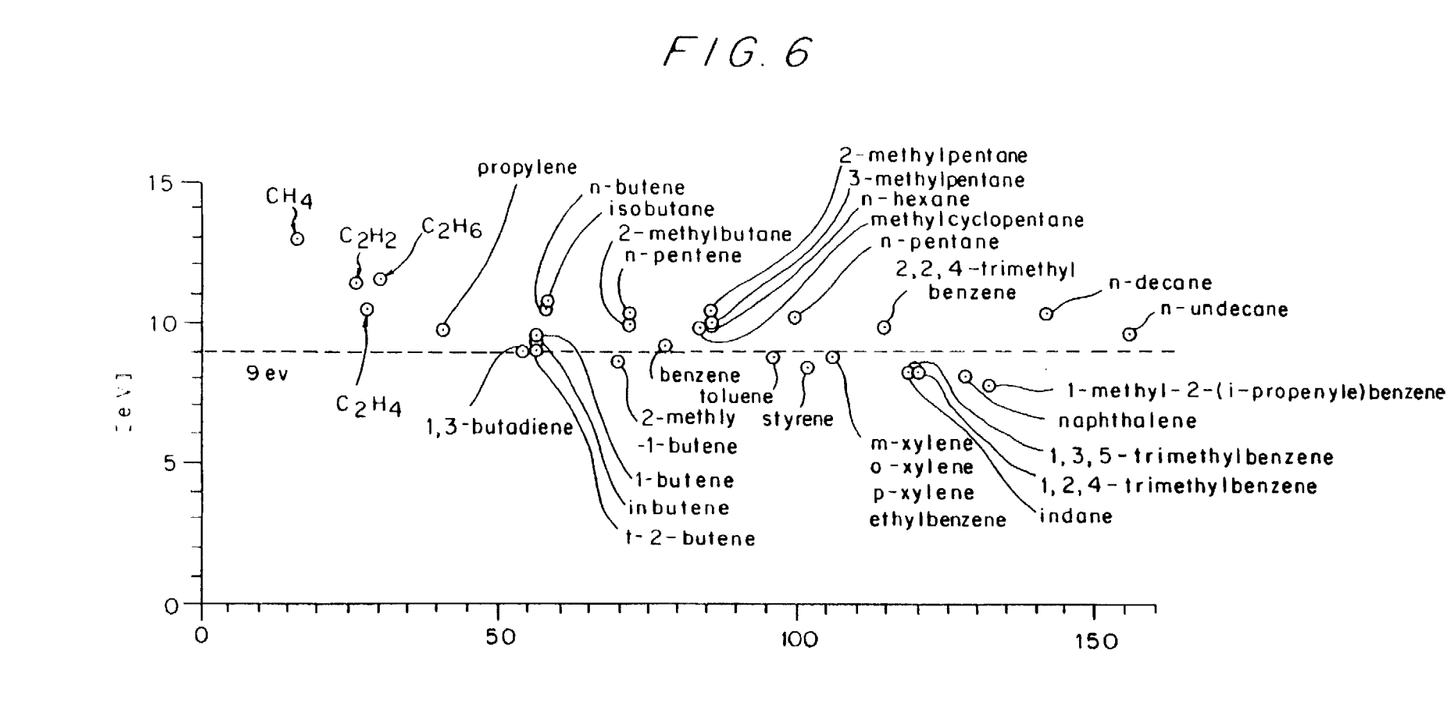
FIG. 6 is a graph which shows relation between Ionization potentials of the respective molecules and molecular weight.

The high vacuum means has vacuum chamber 11, analysis cell 2 and introduction pipe 34 as shown in FIG. 5.

Vacuum evacuation pump 32, being employed as an evacuation means is fitted to one end of the vacuum chamber 11. Vacuum detector 33 is provided at the side wall of the vacuum chamber 11, and degree of vacuum in this vacuum chamber can be measured by the vacuum detector 33.

To another end of the vacuum chamber 11 is connected a sample gas supplying pipe 35 for supplying a sample gas into the analysis cell 2, and opening of this sample gas supplying pipe 35 opens at the another end face of the vacuum chamber 11. This vacuum chamber 11 is always evacuated by the vacuum evacuation pump 32 to maintain a high vacuum of better than $10^{-7}$ Pa.

The analysis cell 2 is disposed in the vacuum chamber 11. In this example, especially, the analysis cell 2 is disposed at the position which is inside the another end of the vacuum chamber 11 and is center of static magnetic field provided by permanent magnet 3.

Figure 2:
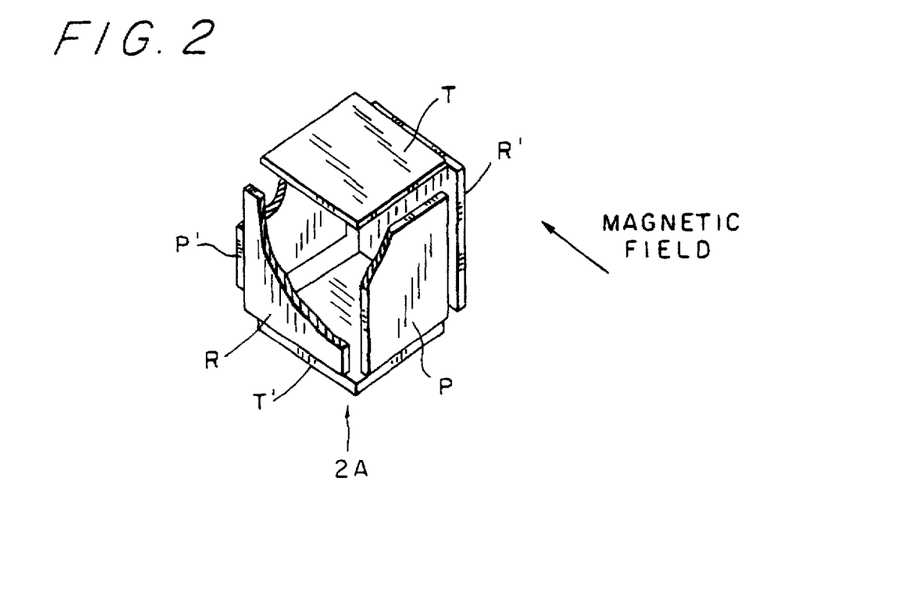
FIG. 2 is a illustration of one example of an analysis cell applied to the Fourier transform ion cyclotron resonance mass spectrometer which is one embodiment of the present invention.

The analysis cell 2 has a hexahedral call 2A as shown in FIG. 2. As the hexahedral cell 2A, there may be used a cubic cell comprising a pair of electrodes perpendicular to the direction of magnetic field of the permanent magnet 3, a pair of irradiating electrodes parallel to the magnetic field and perpendicular to each other, and a pair of receiving electrodes. Such cubic cells may include conventional cells as described in M. B. Comisarow, "Cubic Trapped Ion Cell for Ion Cyclotron Resonance", Int. J. Mass Spect. Ion Phys., 37, (1981), p.251-257, and others.

In this example, the hexahedral cell 2A has three pairs of electrodes, namely, a pair of receiving electrodes R, R', a pair of trap electrodes P, P' and a pair of irradiation electrodes T, T' as shown in FIG. 2.

As shown in FIG. 2, in this hexahedral cell 2A, a slight positive potential, for example, 0.1-2 V is applied to a pair of the trap electrodes P, P' disposed in perpendicular to the direction of magnetic field in order to prevent ions in the analysis cell 2 from drifting in the direction of magnetic axis. The irradiation electrodes T, T' are arranged opposite to each other and along the direction of the magnetic field between a pair of the trap electrodes P, P', so that a high-frequency signal which excites ion cyclotron resonance is applied to the ions generated In the hexahedral cell 2A for a short time, for example, 0.1-10 ms. The receiving electrodes R, R' are arranged opposing to each other and along the direction of the magnetic field and in perpendicular to the trap electrodes P, P' and the irradiation electrodes T, T', and they receive a high-frequency signal voltage induced by the ion cyclotron resonance.

The permanent magnet 3 which is a part of the magnetic field applying means has a pair of magnetic pole pieces. 3a, 3b arranged opposing to each other with interposing the analysis cell 2 therebetween.

As shown in FIG. 3, the variable wavelength light irradiating device 40 is provided with excimer laser 41 which is a light emitting means, variable wavelength laser 44, frequency doubler device 45 and reflective mirror 42, and a pulse laser beam emitted from the excimer laser emitter 41 can be pumped by the variable wavelength laser 44, this laser beam can be converted to a laser beam processed by the frequency doubler device 45, and this laser beam can be guided into the hexahedral cell 2A through the reflective mirror 42 and the viewport 43.

In this example, at least the emission timing and the intensity of the laser beam emitted from the excimer laser emitter 41 which is a light emitting means are controlled by the control circuit 6. A dye laser is used as the variable wavelength laser 44. The pulse laser beam emitted from the excimer laser emitter 41 is swept from 320 to 950 nm by the variable wavelength laser 44.

The control circuit 6 outputs control signals to high-frequency emitter 4a and high-frequency transmitter 4b under the computer control so that the various operations prescribed in the Fourier transform method, such as ionization, high-frequency irradiation, measurement, quenching of residual ions and the like can be actuated in accordance with the specified order.

Figure 4:
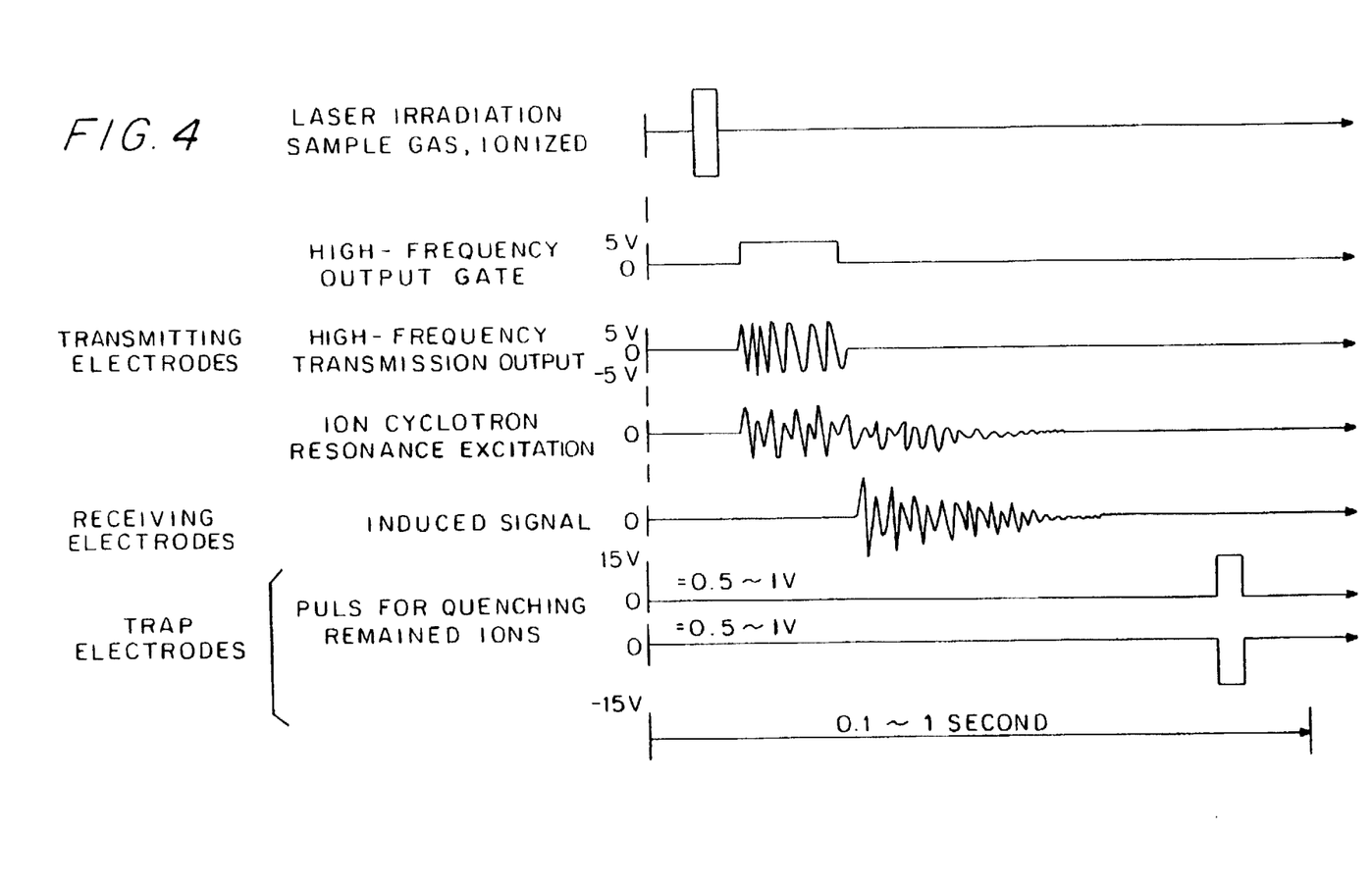
FIG. 4 is a timing chart which shows the change in potential of the respective electrodes constituting the analysis cell.

FIG. 4 shows one example of a typical relation between the applied voltage of each electrode of the analysis cell and the induced signal in the analysis period.

(a) First, the sample gas molecule is ionized by the pulse high-frequency laser beam irradiated to the inside of the cell by light irradiating device 40.

(b) After irradiation of the high-frequency laser beam, the output gate of the high-frequency transmitter 4b opens after a previously determined lapse of time.

(c) An irradiation frequency which is a high-frequency pulse is applied to the irradiating electrodes T, T' of analysis cell 2 from the high-frequency emitter 4a.

(d) Ions excited by the irradiation frequency induce ion cyclotron resonance. After the ions are excited, the output gate is closed.

(e) Thus, signal of ion cyclotron resonance is induced at the receiving electrodes R, R'.

(f) After the ion cyclotron resonance signal is received by the receiving electrodes R, R' and just before the next measuring period, a positive potential and a negative potential are respectively given to the trap electrode pair P, P' disposed in perpendicular to the magnetic axis, and the ions remaining in the analysis cell 2 are quenched.

The control circuit 6 is a circuit to control the respective electrode voltages in the analysis cell 2, which performs the function to irradiate the laser beam to the sample molecule introduced into the analysis cell 2 to ionize the molecule prior to the application of the high-frequency pulse upon receiving instructions from computer 27, the function to intercept the irradiation with laser beam at the time of application of the high-frequency pulse and during the period of measurement of the ion cyclotron resonance signal, and the function to quench the remaining ion at the termination of the measurement.

The resonance signal detecting means 7 is provided with pre-amplifier 20, high-frequency amplifier 21, low-pass filter 22, and A/D converter 23 which carries out a high-speed processing.

The pre-amplifier 20 amplifies individually the ion cyclotron resonance signals induced to receiving electrodes R, R' in the analysis cell 2 and then outputs them to the high-frequency amplifier 21.

The high-frequency amplifier 21 includes a frequency mixer not shown in FIG. 1. That is, it carries out mixing processing of the amplified ion cyclotron resonance signal and a reference signal of frequency $f_0$ which is separately input from the operation controlling means 8 and converts the ion cyclotron resonance high-frequency signal to a low-frequency signal of a difference frequency between the signal frequency and the frequency $f_0$ and transmits the low-frequency signal to the low-pass filter 22.

The conversion of the frequency is carried out by holding the amplified information of signal waves and converting only the frequency to the difference frequency between the signal frequency and the reference frequency by the same method as so-called hetrodyne detection in communication equipments. The reference frequency $f_0$ is preferably set higher than the ion cyclotron resonance frequency.

The low-pass filter 22 eliminates folding-over signals at the time of the A/D conversion by the A/D converter 23, and the cut off frequency is set in advance to be ½ or lower of the clock frequency of the A/D converter 23.

The A/D converter 23 converts the resonance signal from which unnecessary frequency band is eliminated and which is simultaneously amplified to the signal level to such an extent as being A/D convertible, to the digital signal and outputs the digital signal to the operation controlling means 8.

The operation controlling means 8 comprises a computer 27 which carries out control of the whole system and operations such as subtraction processing, a memory device 28, an output device 29, and an interface 30 which controls the A/D converter 23 and, furthermore, receives the output from the A/D converter 23 at a high speed and transmits a control signal from the computer 27 to the control circuit 6.

The resonance signal from which the unnecessary frequency band has been eliminated and which has been amplified to the signal level adequate to the A/D converter 23 is converted to a digital signal by the A/D converter 23, transferred to the computer 27 through the interface 30, and stored in the memory device 28 as a time-domain datum. After the measurement, the time-domain datum is subjected to high-speed Fourier transform processing by the computer 27 and converted to frequency-domain datum, namely, a normal mass spectrum, which is again stored in the memory device 28. This memory device 28 has at least the first memory not shown in FIG. 1 which stores the first mass spectrum obtained by irradiation with a laser beam of a specific wavelength and the second memory not shown in FIG. 1 which stores the second mass spectrum obtained by irradiation with a laser beam having a wavelength slightly different from the specific wavelength of the above laser beam.

These measurement control operations are all automatically performed by the control signal from the computer 27 through the interface 30.

Next, the action of the above-mentioned devices will be explained.

A sample gas is introduced into analysis cell 2 from sample gas supplying pipe 35 through introduction pipe 34. In this example, since the introduction pipe 34 is provided between a sample introduction port of vacuum chamber 11 and the analysis cell 2, the whole of the sample gas is introduced into the analysis cell 2, thereby to inhibit the sample gas from diffusing in the vacuum chamber 11 without entering into the analysis cell 2. As a result, especially, when the amount of the sample gas is slight, the sample gas can be efficiently subjected to measurement and the measuring sensitivity in mass spectrometric analysis is improved.

The introduced sample gas is ionized upon irradiation with the laser beam emitted from light irradiating device 40. In more detail, in the light irradiating device 40, a laser beam in the form of pulse is emitted from excimer laser emitter 41 and wavelength variable laser 41 which is a pumping device emits a laser beam of 320–950 nm in wavelength. Since this wavelength is still not sufficiently short, a laser beam having a frequency which is twice higher than the frequency of the above laser beam is formed by frequency doubler device 45, and the sample gas in the analysis cell is irradiated with this laser beam. In the sample gas irradiated with the laser beam, only the molecules having an energy level of the laser beam which satisfies the conditions of multi-photon ionization strongly absorb the energy and are ionized. The molecules which do not satisfy the conditions of the multi-photon ionization are not ionized but removed from the vacuum chamber 11 by the vacuum evacuation pump 32.

The ionized specific component in the sample gas is retained in the analysis cell 2 by applying a voltage to the trap electrodes P, P', and the ions do rotational movement in a plane perpendicular to the magnetic field due to the interaction between the electric charge possessed by the ionized specific component and the static magnetic field applied to the analysis cell 2.

For this rotational movement of ions, application of a high-frequency field from the irradiation electrodes T, T' in the analysis cell 2, ions which are in ion cyclotron resonance to result in uniform phases, form ion packet and increase in radius of the rotation.

Even after cutting off the high-frequency voltage, ions of the ionized specific molecule continue the rotational movement. The ions gradually lose kinetic energy owing to collision with the remaining gas molecules and diminish. Such decaying rotational movement of ions induces decaying vibration signal in the receiving electrodes R, R'. The frequency of the signal equals to the rotational frequency of ions and the amplitude is proportional to the number of the ions.

The induced decaying signals are successively transmitted to the operation controlling means 8 through resonance signal detecting means 7.

The transmitted decaying signals are converted to digital signals, and after converted, they undergo Fourier transformation by the computer and a mass spectrum can be obtained as a frequency component. The resulting mass spectrum is once stored in the memory device 28.

When the component ionized by the energy of the light having a specific wavelength irradiated by the light irradiating device 40 comprises a single species, the component can be identified from the resulting mass spectrum. Furthermore, determination of the quantity of the component can be performed from the peak area of the mass spectrum and others.

When the component ionized by the energy of the light having a specific wavelength irradiated by the light irradiating device 40 comprises a plurality of species, the mass spectrum obtained by the first laser beam irradiation, i.e. the first mass spectrum, is a mixed mass spectrum composed of mass spectra of a plurality of the components. This composite mass spectrum is stored in the first memory in the memory device 28.

Then, the second laser beam having a wavelength slightly different from that of the first laser beam is irradiated to the sample gas in the analysis cell 2. Only the component wherein the energy level of the second laser beam satisfies the conditions of multi-photon ionization thereof strongly absorbs the energy of said laser beam and are ionized. This ion is excited in the same manner as in irradiating the first laser beam to cause ion cyclotron resonance and a mass spectrum is obtained. This mass spectrum is a mixed spectrum composed of mass spectra of a plurality of the components. In this example, this mass spectrum is called the second mass spectrum. The second mass spectrum is once stored in the second memory in the memory device 28.

The first mass spectrum stored in the first memory and the second mass spectrum stored in the second memory are read out and subjected to subtraction processing by the computer 27. A difference spectrum is obtained by the subtraction processing. It becomes possible by this difference spectrum to carry out identification and determination of the specific component having an ionization potential between the energy level of the first laser beam and the energy level of the second laser beam. The identification and determination of a specific molecule will be explained below more specifically.

When the sample gas is a mixed gas of the components equal in molecular weight, for example, 1-butene, isobutene and t-2-butene, three mass spectra are obtained by irradiation with lights having different wavelength since they differ in ionization potential, and mass spectrum for each molecule is obtained by the subtraction processing, and, thus, identification and quantitation become possible.

As explained above, in the present invention including this example, energy level of the light firstly irradiated to the sample gas is set at such level as including the ranges of ionization potential of all components in the sample gas to be analyzed, and a mass spectrum obtained by irradiating the sample gas with this light having the maximum energy level is stored in the memory device as the first mass spectrum. Then, another mass spectrum obtained by irradiating the sample gas with a light having an energy level slightly lower than the above energy Level is stored in the memory device as the second mass spectrum. When the second mass spectrum is subtracted from the first mass spectrum, the resulting difference spectrum is a mass spectrum of the component having an ionization potential present between the energy level of the first irradiated light and that of the second irradiated light. Similarly, the third mass spectrum is obtained by irradiating the sample gas with a light having an energy slightly smaller than that of the second irradiated light. The above second mass spectrum is used as the first mass spectrum of the present invention and the above third mass spectrum is used as the second mass spectrum of the present invention, and the second mass spectrum is subtracted from the first mass spectrum to obtain a difference spectrum. This difference spectrum is a mass spectrum of the component having an ionization potential present between the energy level of the second irradiated light and that of the third irradiatedlight.

In this way, by varying the energy level of the light irradiated to the sample gas, in other words, by varying the wavelength of the light irradiated to the sample gas, a mass spectrum is obtained for every irradiation of light and the resulting spectra are subjected to subtraction processing and the wavelength of the light to be varied is properly selected, whereby mass spectra of the components equal in mass, but different in ionization potential can be separated. As a result, for example, separation of the mass spectra of the respective isomers can also be performed, and, thus, identification of a specific component can be performed. Moreover, when mass spectrum of the specific component is obtained, it also becomes possible to determine the quantity of the specific component in the sample gas by calculating the area of the spectrum peak. The wavelength of the light which is varied and employed for every irradiation is suitably determined depending on the components contained in the sample gas.

On the other hand, when the sample gas is, for example, an exhaust gas from automobiles, as the molecules ionized by irradiating a light of the wavelength which provides an ionization potential of 9 eV, for example, molecules of 1,3-butadiene and t-2-butene are ionized and a mixed mass spectrum based on these two kinds of molecules is obtained. The mass number of 1,3-butadiene is 54 and that of t-2-butene is 56. Therefore, when the power of light irradiated by the wavelength variable light irradiating device is reduced to carry out a soft ionization, the interference with fragment ions can be avoided and the ions derived from both of the two compounds can be separated and determined as molecular peaks differing in mass number.

Figure 7:
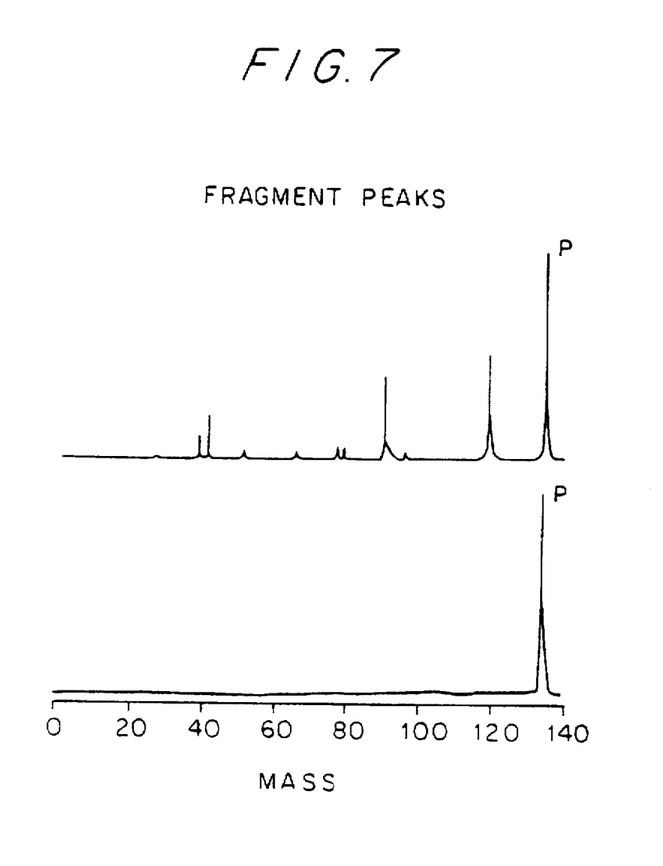
FIG. 7 shows a mass spectrum obtained when a sample gas was irradiated with a light having an irradiation power of high or low using the Fourier transform ion cyclotron resonance mass spectrometer which is one embodiment of the present invention.

FIG. 7 shows a mass spectrum of a sample. It can be easily understood from FIG. 7 that when a sample is irradiated with a laser beam having an appropriate wavelength at a high intensity, a mass spectrum having many fragment peaks is obtained, and when the sample gas is irradiated with a laser beam having an equal wavelength at a low intensity, a mass spectrum having substantially no fragment peaks and having emphasized molecular peak is obtained.

Accordingly, in the present invention including the apparatus of this example, a mass spectrum having separated molecule peaks for a plurality of molecules having the same ionization potential but differing in molecular weight can be obtained by lowering the intensity of laser beam power from the wavelength variable light irradiating device or the intensity of light irradiated from the wavelength variable light irradiating means.

An example of the present invention has been explained hereinabove, but this example is an illustration of the present invention. It is needless to say that the present invention can be applied to analysis of other mixed gases without departing from the scope of the invention.

The present invention can provide an apparatus for the analysis of mixed gas components according to which even when the sample gas contains a plurality of components having the same molecular weight but differing in ionization potential, mass spectrum of each component can be obtained separately, and identification and determination of the respective components can be performed in high precision.

The present invention can provide an apparatus for the analysis of mixed gas components according to which even when the sample gas contains a plurality of components having the same or substantially the same ionization potential, but differing in molecular weight, mass spectrum of each component can be obtained separately, and identification and determination of the respective components can be performed in high precision.

The present invention has solved not only the problem of complexity of using, in a row, a plurality of analytical instruments differing in principles, but also the problem of unexpected and inevitable errors in measurement as seen when interfering components are present. Furthermore, the present invention has solved the problem of requiring a long measuring period of several minute to several ten minutes when carrying out a pretreatment of separating the components by gas chromatography. Thus, the effect brought about by the present invention ishighly noticeable.

The apparatus for the analysis of mixed gas components of the present invention is particularly suitable in case when analysis of components of an exhaust gas of automobiles must be performed in a short time.

We claim:

1. A method for analyzing components of a gas mixture, the method including Fourier transform ion cyclotron resonance mass spectrometry, the spectrometry including the steps of providing a vacuum cell, creating a static magnetic field within the cell;

ionizing the gas, creating a high-frequency electric field within the cell to induce ion cyclotron resonance, and detecting a high-frequency decaying electric signal; and Fourier-transforming the electric signal into a frequency-domain spectrum;

wherein the step of ionizing further comprises irradiating the gas mixture within the cell with monochromatic light having a first predetermined wavelength at which one component of the mixture is ionized, and irradiating the gas mixture within the cell with monochromatic light having a second predetermined wavelength at which one component of the mixture is not ionized;

the method further comprising the steps of obtaining by the spectrometry a second frequency-domain spectrum of the gas mixture;

obtaining by the spectrometry a first frequency-domain spectrum of the gas mixture; and subtracting the second frequency-domain spectrum from the first frequency-domain spectrum to obtain an isolated frequency-domain spectrum of the one component.

2. An apparatus for analyzing components of a gas mixture by Fourier transform ion cyclotron resonance mass spectrometry, comprising:

a spectrometer further comprising means for providing a vacuum cell, means for creating a static magnetic field within the cell, means for ionizing the gas, means for creating a high-frequency electric field within the cell to induce ion cyclotron resonance, and means for detecting a high-frequency decaying electric signal; and means for Fourier-transforming the electric signal into a frequency-domain spectrum;

wherein the means for ionizing further comprises means for irradiating the gas mixture within the cell with monochromatic light having a first predetermined wavelength at which one component of the mixture is ionized, and means for irradiating the gas mixture within the cell with monochromatic light having a second predetermined wavelength at which one component of the mixture is not ionized;

and wherein the apparatus further comprises means for obtaining by the spectrometry a second frequency-domain spectrum of the gas mixture;

means for obtaining by the spectrometry a first frequency-domain spectrum of the gas mixture; and means for subtracting the second frequency-domain spectrum from the first frequency-domain spectrum to obtain an isolated frequency-domain spectrum of the one component.

* * * * *